United States Patent
Ruso et al.

(10) Patent No.: US 12,262,502 B2
(45) Date of Patent: Mar. 25, 2025

(54) COMPUTING DEVICES WITH IMPROVED THERMAL MANAGEMENT

(71) Applicant: Mellanox Technologies, Ltd., Yokneam (IL)

(72) Inventors: Ran Hasson Ruso, Tel Aviv (IL); Tahir Cader, Spokane Valley, WA (US); Elad Mentovich, Tel Aviv (IL); Susheela Narasimhan, Fremont, CA (US)

(73) Assignee: Mellanox Technologies, Ltd., Yokneam (IL)

( * ) Notice: Subject to any disclaimer, the term of this patent is extended or adjusted under 35 U.S.C. 154(b) by 232 days.

(21) Appl. No.: 17/968,447

(22) Filed: Oct. 18, 2022

(65) Prior Publication Data

US 2024/0130069 A1    Apr. 18, 2024

(51) Int. Cl.
*H05K 7/20* (2006.01)
*G06F 1/20* (2006.01)

(52) U.S. Cl.
CPC ......... *H05K 7/20136* (2013.01); *G06F 1/206* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,625,274 B2* | 1/2014 | Lin | | G06F 1/3206 |
| | | | | 361/679.46 |
| 8,817,473 B2* | 8/2014 | Babish | | H05K 7/20781 |
| | | | | 165/80.4 |
| 9,384,077 B2* | 7/2016 | Ogawa | | G06F 3/0614 |
| 9,596,784 B2* | 3/2017 | Duncan | | H05K 7/20136 |
| 10,201,116 B1* | 2/2019 | Ross | | H05K 7/20836 |
| 10,455,727 B1* | 10/2019 | Mikjaniec | | H05K 7/20136 |
| 10,856,055 B2* | 12/2020 | Weltsch | | H05K 7/20772 |
| 10,969,841 B2* | 4/2021 | North | | G06F 1/181 |
| 11,927,996 B2* | 3/2024 | Grossmann | | G05B 19/4155 |
| 11,963,338 B2* | 4/2024 | Edmunds | | H05K 7/20772 |

(Continued)

OTHER PUBLICATIONS

Derjani-Bayeh, Sylvana et al., Chapter 16 Using Science Fiction in Chemical Engineering Education, [online] Innovations 2009 World Innovations in Engineering Education and Research, Jan. 2009, pp. 187-201, INEER. Retrieved from the internet <https://www.researchgate.net/publication/232806871_Chapter_16_Using_Science_Fiction_in_Chemical_Engineering_Education>.

(Continued)

*Primary Examiner* — Lisa Lea-Edmonds
(74) *Attorney, Agent, or Firm* — Michael M. McCraw; Moore & Van Allen PLLC (57) ABSTRACT

Devices, apparatuses, systems, and methods are provided for improved thermal management in networking computing devices. An example thermal management apparatus includes a housing defining a first end and a second end opposite the first end. The apparatus further includes an electronic component supported within the housing, such as a GPU. The apparatus includes a primary inlet that receives a primary airflow having a first temperature and a secondary inlet that receives a secondary airflow having a second temperature where the second temperature is different than the first temperature. The primary airflow and the secondary airflow are collectively configured to dissipate heat generated by the electronic component.

20 Claims, 6 Drawing Sheets

(56) References Cited

U.S. PATENT DOCUMENTS

| | | | | |
|---|---|---|---|---|
| 2011/0292602 | A1* | 12/2011 | Narasimhan | H05K 7/20727 165/104.34 |
| 2013/0077238 | A1* | 3/2013 | Babish | H05K 7/20736 361/689 |
| 2013/0083478 | A1* | 4/2013 | Lin | G06F 1/3287 361/679.48 |
| 2014/0313669 | A1* | 10/2014 | Babish | H05K 7/20736 165/80.4 |
| 2021/0007240 | A1* | 1/2021 | Badihi | H05K 7/20727 |
| 2022/0350382 | A1* | 11/2022 | Grossmann | G06F 1/206 |
| 2023/0070920 | A1* | 3/2023 | Huang | G06F 1/206 |
| 2023/0413494 | A1* | 12/2023 | Ganju | H05K 7/20263 |
| 2024/0090165 | A1* | 3/2024 | Weltsch | H04Q 1/035 |
| 2024/0130069 | A1* | 4/2024 | Ruso | G06F 1/206 |

OTHER PUBLICATIONS

Polihronov, J. et al. The Maximum Coefficient of Performance (COP) of Vortex Tubes [online]. Canadian Journal of Physics. (2015) 93 (11): 1279-1282. Retrieved from the internet <doi: 10.1139/cjp-2015-0089>.

Vortex tube—Wikipedia [online]. Retrieved from the internet <https://en.wikipedia.org/w/index.php?title=Vortex_tube&oldid=1137235635>.

Ganju et al., pending U.S. Appl. No. 63/352,250, filed Jun. 15, 2022.

Mohr et al., pending U.S. Appl. No. 17/879,620, filed Aug. 2, 2022.

Ruso, et al., pending U.S. Appl. No. 17/892,283, filed Aug. 22, 2022.

Ganju, et al., pending U.S. Appl. No. 17/935,511, filed Sep. 26, 2022.

Cader, et al., pending U.S. Appl. No. 18/100,296, filed Jan. 23, 2023.

Cader, et al., pending U.S. Appl. No. 18/118,958, filed Mar. 8, 2023.

* cited by examiner

COMPUTING DEVICES WITH IMPROVED THERMAL MANAGEMENT

TECHNOLOGICAL FIELD

Example embodiments of the present disclosure relate generally to high-performance networking and computing systems and, more particularly, to network computing devices with improved thermal management.

BACKGROUND

High-performance computing systems, such as those used in datacenters and other networking environments (e.g., datacom, telecom, and/or other similar data/communication transmission networks), may leverage numerous electronic components (e.g., central processing units (CPUs), graphics processing unit (GPUs), etc.) to perform the operations associated with these environments. During operation, the heat generated by these components may impact the overall operation of the computing systems, particularly as the operational capability of these components increases. Applicant has identified a number of deficiencies and problems associated with conventional heat dissipation techniques. Through applied effort, ingenuity, and innovation, many of these identified problems have been solved by developing solutions that are included in embodiments of the present disclosure, many examples of which are described in detail herein.

BRIEF SUMMARY

Apparatuses, systems, and methods are provided for improved thermal management in networking computing devices. With reference to an example thermal management apparatus, the apparatus may include a housing that defines a first end and a second end opposite the first end. The apparatus may further include an electronic component supported within the housing, a primary inlet, and a secondary inlet. The primary inlet may be configured to receive a primary airflow having a first temperature and the secondary inlet may be configured to receive a secondary airflow having a second temperature. The second temperature may be different than the first temperature. The primary airflow and the secondary airflow may be collectively configured to dissipate heat generated by the electronic component.

In some embodiments, the primary inlet and the secondary inlet may be disposed proximate the first end of the housing.

In some further embodiments, the primary airflow and the secondary airflow may collectively define an airflow direction traveling from the first end of the housing to the second end of the housing.

In some still further embodiments, the primary airflow and the secondary airflow may collectively exit the housing via the second end.

In some embodiments, the primary airflow and the secondary airflow may be collectively configured to dissipate heat generated by the electronic component while maintaining an air temperature internal to the housing greater than a dew point associated with an interior of the housing.

In some embodiments, the second temperature may be less than the first temperature.

In some embodiments, a temperature of the airflow exiting the housing via the second end may be greater than the dew point of the external environment of the housing.

In some embodiments, the apparatus may further include a computing device communicably coupled to the primary airflow and the secondary airflow.

In some further embodiments, the computing device may be configured to modify one or more parameters of the primary airflow or the secondary airflow based upon one or more operating characteristics of the electronic component.

In some embodiments, the computing device may be configured to modify the second temperature of the secondary airflow.

In some embodiments, the computing device may be configured to modify a flow rate of the primary airflow or the secondary airflow.

In some embodiments, the apparatus may further include a plurality of electronic components including the electronic component.

In some further embodiments, the apparatus may include an air direction mechanism configured to selectively dissipate heat from one or more of the plurality of electronic components.

In any embodiment, the electronic component(s) may be graphics processing units (GPUs).

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, datacenters and other networking environments (e.g., datacom, telecom, and/or other similar data/communication transmission networks), may leverage numerous electronic components (e.g., CPUs, GPUs, etc.) to perform the operations associated with these environments. During operation, the heat generated by these components may impact the overall operation or performance of the computing systems. The thermal burden of these components may be further increased in high performance/power computing systems, such as high-power GPU systems, with rapidly increasing power consumption levels for not only the primary computing components (e.g., GPUs, CPUs, etc.) but also for the circuit boards and related secondary components that support the operations of these primary computing components.

Conventional methods for dissipating heat or otherwise reducing the thermal burden of these systems rely upon air-based cooling techniques. For example, a singular airflow that is relatively cooler than the temperature of the electronic/computing components may be supplied to these environments (e.g., convective cooling). These techniques, however, are incapable of providing effective heat dissipation due to the relatively low heat carrying capacity of air, the pressure requirement for driving the circulation of air, and/or the increased surface area (e.g., heatsink surface area) required for effective air-cooling. Emerging liquid or immersion cooling technologies attempt to address the deficiencies of air-based cooling techniques; however, these liquid-based technologies not only required unique and complex infrastructures, but further pose an increased risk of damage to the electronic components (e.g., unintended interaction between the cooling fluid and the electronic components).

In order to address these issues and others, the embodiments of the present disclosure may leverage multiple airflows of differing temperatures to increase the effective heat dissipation from the electronic components (e.g., GPUs, CPUs, etc.) within datacenter racks and networking enclosures. In particular, the embodiments described hereinafter may improve thermal management by injecting a sufficiently cold secondary airflow into a primary airflow in order to substantially reduce the relative temperature of the air passing through the networking enclosure. This temperature differential, however, may be determined with consideration of the applicable dew point associated with the internal and external environment of the networking enclosure (e.g., a housing of the disclosed thermal management apparatus) so as to prevent the condensation of moisture of the air within these environments. Said differently, the resultant temperature of the mixture of the primary and secondary airflows may remain above the dew point of the related environment to prevent condensation on the server surfaces. Furthermore, the embodiments described herein may provide selective heat dissipation by dynamically modifying parameters (e.g., temperature, air speed, etc.) of this secondary airflow to account for the changing operating characteristics of the electronic components of these systems. In doing so, the embodiments of the present disclosure significantly increase the heat dissipation capabilities of air-based thermal management systems without the need for additional, complex infrastructures and while accounting for associated condensation concerns.

Thermal Management Apparatus

Figure 1:
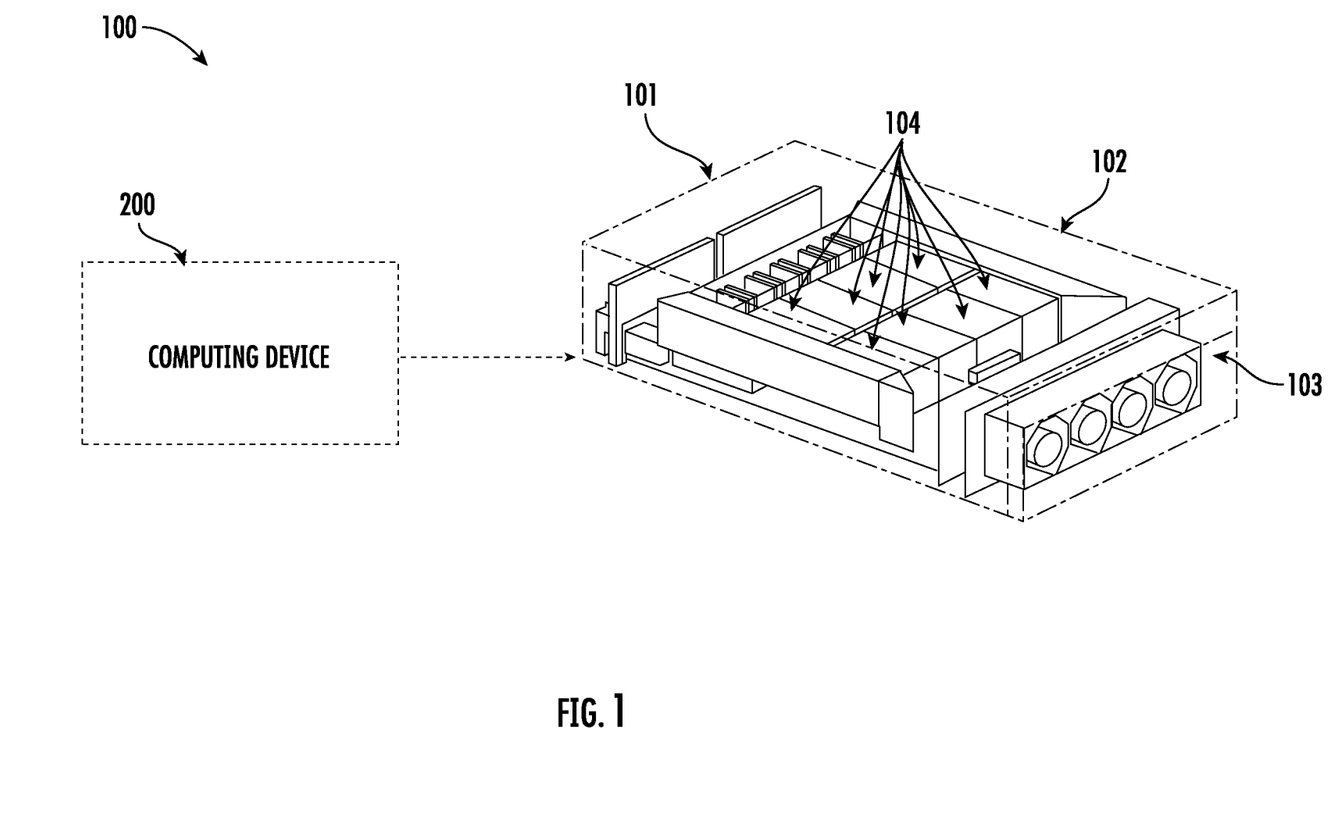
FIG. 1 illustrates an example thermal management apparatus and computing device in accordance with some embodiments described herein.

With reference to FIG. 1, an example thermal management apparatus 100 of the present disclosure is illustrated. As shown, the thermal management apparatus 100 may include a housing 102 that may support various electronic components 104 therein. In some embodiments, the housing 102 may be a networking enclosure that is configured for use as part of a datacenter rack implementation. Although described herein with reference to a datacenter rack implementation, the present disclosure contemplates that the housing 102 and associated electronic components 104 may be configured for use in any implementation based upon the intended application of the apparatus 100. Said differently, the thermal management techniques described herein may be applicable to any application in which improved heat dissipation may be beneficial.

With continued reference to FIG. 1, the housing 102 may define a first end 101 and a second end 103. As shown, the second end 103 may be positioned opposite the first end 101, such as in instances in which the housing 102 is formed as a rectangular box or any other configuration having a rectangular cross-sectional shape. Although illustrated as a housing defining a rectangular cross-sectional shape, the present disclosure contemplates that the housing 102 may be dimensioned (e.g., sized and shaped) based upon the intended application of the thermal management apparatus 100. As such, the relative positioning between the first end 101 and the second end 103 may similarly vary based upon the intended application of the thermal management apparatus 100. In other words, although illustrated herein with a first end 101 and a second end 103 opposite one another, the present disclosure contemplates that the housing 102 may define any number of edges, ends, surfaces, etc. located at any position, orientation, and/or the like.

As described above, the housing 102 may define an enclosure within which one or more electronic components 104 may be supported. By way of example, the housing 102 may be a networking enclosure that supports a plurality of GPUs 104 as part of a high-performance computing system. In the example illustrated in FIG. 1, the housing 102 may support eight (8) GPUs 104; however, the present disclosure contemplates that the housing 102 may support any number of GPUs 104 at any position, location, orientation, etc. based upon the intended application of the thermal management apparatus 100. Although described herein with reference to GPU(s) as example electronic components 104, the present disclosure contemplates that any device, element, feature, etc. that generates heat (e.g., CPU, GPU, optical components, switches, etc.) may be supported by the housing 102. In order to provide optical and/or electrical connectivity to the electronic components 104 within the housing 102, the housing 102 may include any number of printed circuit boards (PCBs), electrical traces, optical waveguides/fibers, etc. without limitation.

Figure 2:
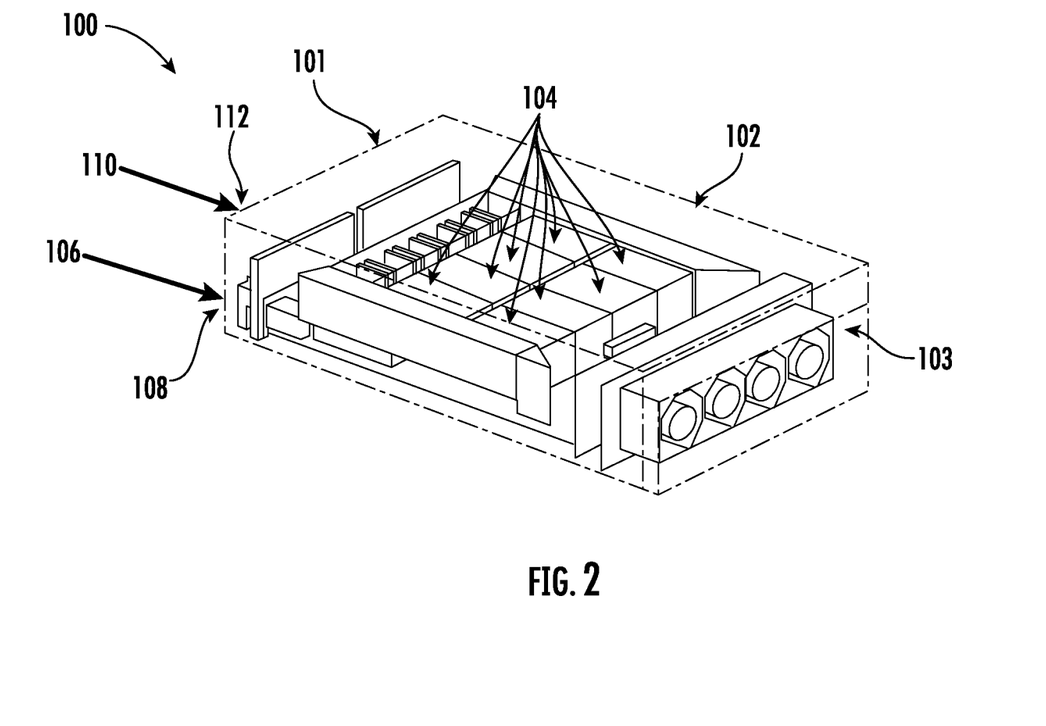
FIG. 2 illustrates the thermal management apparatus of FIG. 1 with associated airflows in accordance with some embodiments described herein.
Figure 3:
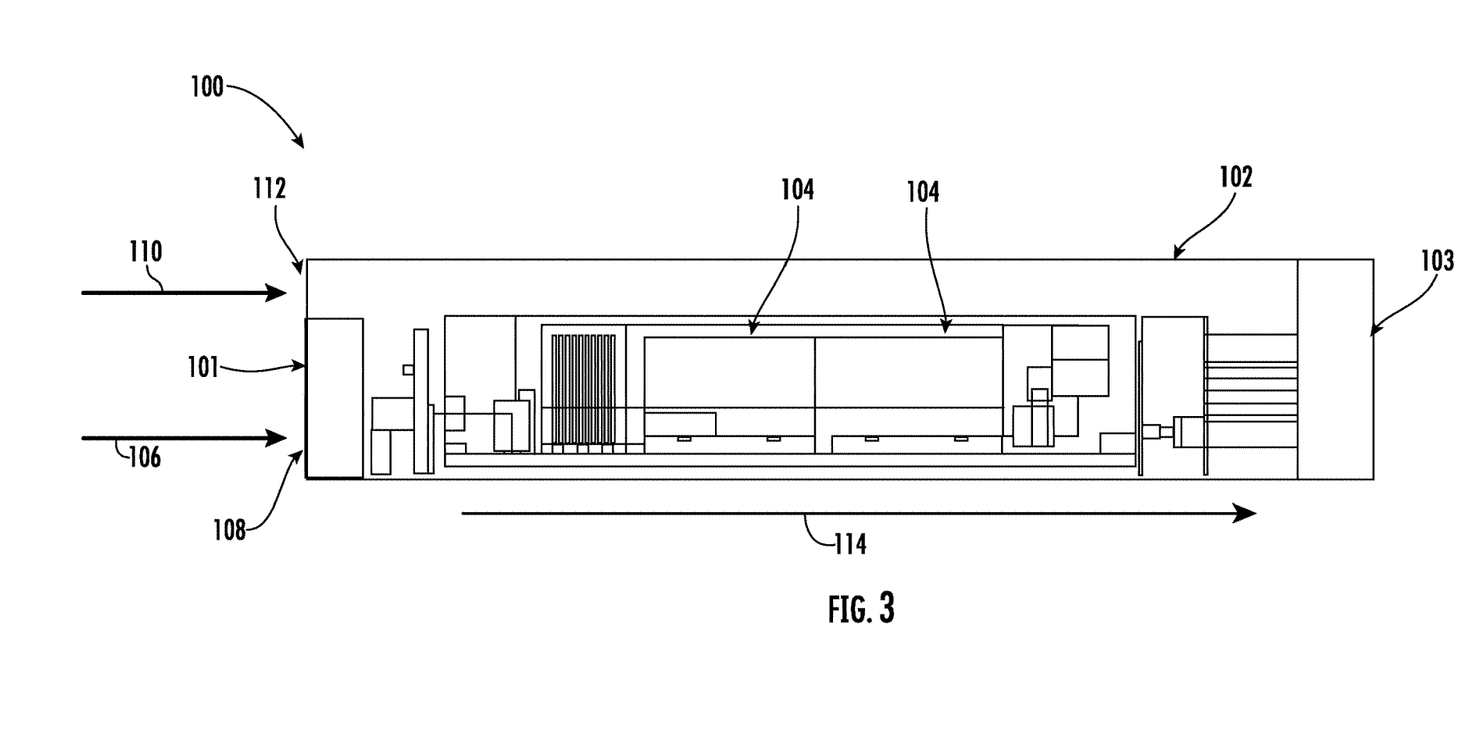
FIG. 3 illustrates a side view of the thermal management apparatus of FIG. 2 in accordance with some embodiments described herein.

As described hereafter with reference to FIGS. 2-3, an airflow direction (e.g., airflow direction 114) may also be defined by the housing 102 where air (e.g., for heat dissipation) is provided to the housing via the first end 101, and the air exits the housing via the second end 103. Although described herein with reference to a first end 101 that is configured to receive air for dissipating heat from the electronic components 104, the present disclosure contemplates that, additionally or alternatively, the second end 103 of the housing may receive air for dissipating heat from the electronic components 104. Furthermore, although described herein with reference to a singular entrance and exit location (e.g., the first end 101 and the second end 103, respectively), the present disclosure contemplates that the housing 102 may define or be in fluid communication with a plurality of openings, inlets, outlets, vents, apertures, etc. through which air may flow.

In some embodiments, in order to control operation of one or more components of the thermal management apparatus 100, a computing device 200 may be communicably coupled with the thermal management apparatus. As described hereafter with reference to FIG. 5, the computing device 200 may be any suitable controller, network card, GPU, microcontroller, computing device, network server, and/or other type of processing device. In some embodiments, the computing device 200 may be operably coupled to the one or more electronic components 104 so as to determine one or more operating characteristics of the electronic component(s) 104 (e.g., temperature, power consumption, etc.). Furthermore, in such an embodiment, the computing device 200 may be operably coupled with a primary airflow and/or a secondary airflow (e.g., primary airflow 106 and secondary airflow 110 in FIG. 2) so as to modify one or more parameters (e.g., air temperature, speed, etc.) of the primary airflow or the secondary airflow.

With reference to FIGS. 2-3, the thermal management apparatus 100 is illustrated with multiple airflows for improving the heat dissipation from the electronic components 104. As shown, the thermal management apparatus 100 may include a primary inlet 108 configured to receive a primary airflow 106. The primary airflow 106 may include any number of associated parameters including at least a first temperature. As would be evident to one of ordinary skill in the art in light of the present disclosure, the first temperature may refer to an average temperature of the air that forms the primary airflow 106 when received by the housing 102 via the primary inlet 108 (e.g., the temperature of the primary airflow 106 may vary at different locations along the primary airflow 106). The primary inlet 108 may define an opening, aperture, channel, etc. in fluid communication with an interior of the housing 102 and the primary airflow 106. In some embodiments, as shown in FIGS. 2-3, the primary inlet 108 may be disposed proximate the first end 101 of the housing 102.

The present disclosure contemplates that the structure of the primary inlet 108 and the location of the primary inlet 108 may vary based upon the dimensions (e.g., size and shape) of the housing 102. Said differently, the present disclosure contemplates that the primary inlet 108 may refer to any location of the housing 102 at which the housing 102 receives the primary airflow 106. In some embodiments, the first temperature of the primary airflow 106 may be approximately 35 C. In some embodiments, the first temperature of the primary airflow 106 may be between approximately 0 C and approximately 35 C. The present disclosure, however, contemplates that the first temperature may include any temperature based upon the intended application of the thermal management apparatus 100 without limitation.

The primary airflow 106 may refer to the airflow that is traditionally supplied to computing devices in order to attempt to dissipate heat from these devices. As such, the primary airflow 106 may be supplied to the housing 102 by one or more conduits, channels, tubes, etc. Furthermore, the primary airflow 106 may be communicably coupled with a fan or similar element configured to drive or otherwise force the primary airflow 106 into the housing 102 and along the airflow direction 114 that travels from the first end 101 to the second end 103 of the housing 102. As described above, the primary airflow 106 alone may be insufficient to effectively dissipate heat form the electronic components 104 supported by the housing 102. Furthermore, due to the potential for condensation to form, the first temperature of the primary airflow 106 may be greater than a dew point of an external environment of the housing 102.

As such, the thermal management apparatus 100 of the present disclosure leverages a secondary inlet 112 configured to receive a secondary airflow 110 having a second temperature that is less than the first temperature. Similar to the primary airflow 106, the second temperature may refer to an average temperature of the air that forms the secondary airflow 110 when received by the housing 102 via the secondary inlet 112 (e.g., the temperature of the secondary airflow 110 may also vary at different locations along the secondary airflow 110). The secondary inlet 112 may define an opening, aperture, channel, etc. in fluid communication with an interior of the housing 102 and the secondary airflow 110. In some embodiments, as shown in FIGS. 2-3, the secondary inlet 112 may also be disposed proximate the first end 101 of the housing 102. The present disclosure; however, contemplates that the secondary inlet 112 may refer to any location of the housing 102 at which the housing 102 receives the secondary airflow 110.

In order to substantially reduce the temperature of the airflow within the housing 102 (e.g., the combined primary airflow 106 and the secondary airflow 110), the second temperature of the secondary airflow 110 may be substantially lower than the first temperature of the primary airflow 106. In some embodiments, for example, the second temperature of the secondary airflow 110 may be approximately 1.7 C. In some embodiments the second temperature of the secondary airflow 110 may be between approximately 0 C and 5 C. The present disclosure; however, contemplates that the second temperature may be any temperature based upon the intended application of the thermal management apparatus 100. In order to generate the secondary airflow 110 having the second temperature, the secondary airflow 110 may be associated with a Ranque-Hilsch vortex tube or other device or technique for generating sufficiently cold air temperatures. The combination of the primary airflow 106 and the secondary airflow 110 within the interior of the housing 102 may substantially lower the collective temperature of the air within the interior of the housing 102.

Although described herein with reference to modification of the second temperature of the secondary airflow 110, the present disclosure contemplates that various operational characteristics, attributes, parameters, etc. of the primary airflow 106 and/or the secondary airflow 110 may be used to modify the temperature of the airflow within the housing 102. For example, the flow rate of the primary airflow 106 and/or the flow rate of the secondary airflow 110 may be modified. By way of an additional example, the first temperature of the primary airflow 106 may be modified (e.g., increased or decreased) independent of or in addition to the second temperature of the secondary airflow 110. Furthermore, although described herein with reference to a temperature differential in which the first temperature is greater than the second temperature, the present disclosure contemplates that the second temperature may, in some embodiments, be greater than the first temperature. Said differently, the present disclosure contemplates that the relative temperature differential between the primary airflow 106 and the secondary airflow 110 may vary based upon the intended application of the thermal management apparatus 100. By way of a nonlimiting example, in some embodiments, the operations described herein with reference to the primary airflow 106 may be instead performed by the secondary airflow 110, and/or the operations described herein with reference to the secondary airflow 110 may be instead performed by the primary airflow 106.

This lower collective temperature, as driven by the substantially lower second temperature, may operate to collectively dissipate an increased amount of heat generated by the electronic components 104 within the housing 102. As shown, this combined airflow within the housing 102 may convectively cool (e.g., dissipate heat from) the electronic components 104 before exiting the housing 102 via the second end 103. In order to avoid the condensation of moisture that may be suspended in the airflows described herein, the first temperature of the primary airflow 106 may greater than a dew point of an external environment of the housing 102 as described above, and a temperature of the airflow exiting the housing 102 via the second end 103 may be greater than the dew point of the external environment of the housing 102. The primary airflow 106 and the secondary airflow 110 may further be collectively configured to dissipate heat generated by the electronic component(s) 104 while maintaining an air temperature internal to the housing 102 that is greater than a dew point associated with an interior of the housing 102. In other words, the injecting of substantially colder air (e.g., the secondary airflow 110 at the second temperature) may substantially reduce the temperature of the air within the housing 102 so as to improve the heat dissipated by this air while preventing unintended condensation that may result in electrical failure for electronic components 104.

Figure 4:
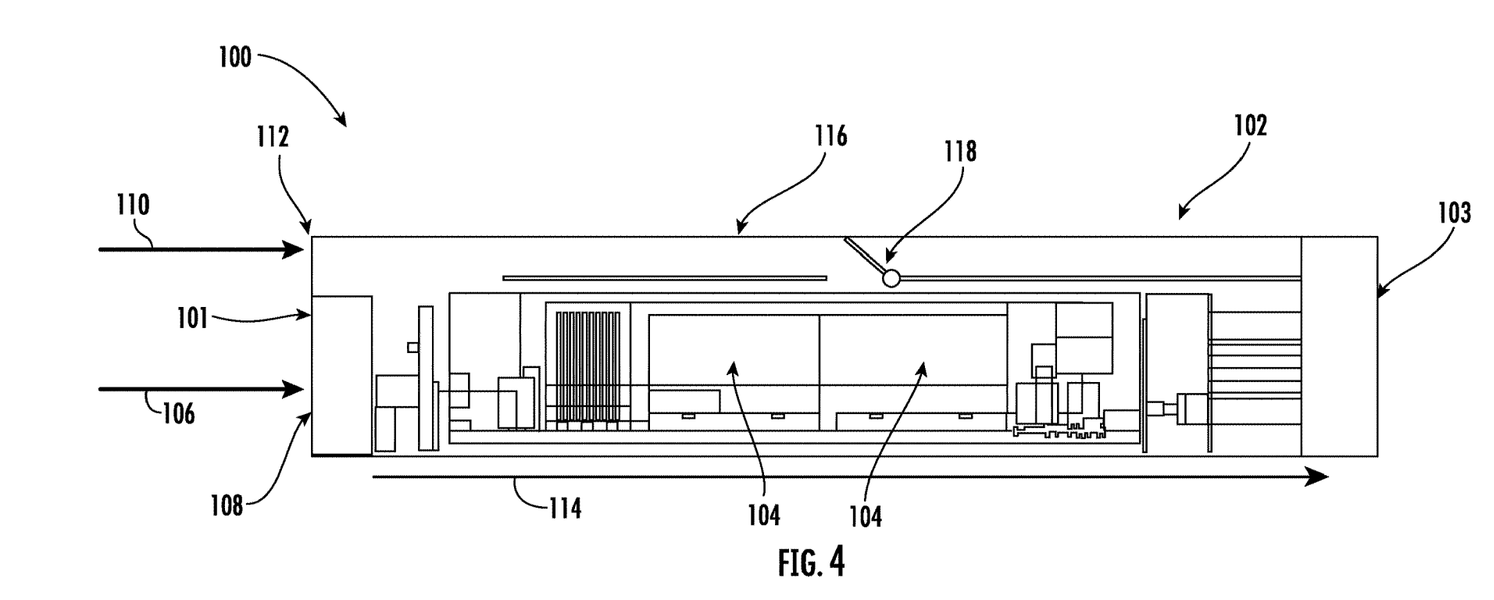
FIG. 4 illustrates the side view of thermal management apparatus of FIG. 3 with an example air direction mechanism in accordance with some embodiments described herein.

With reference to FIG. 4, the thermal management apparatus 100 is illustrated with an example air direction mechanism 118. As would be evident to one of ordinary skill in the art in light of the present disclosure, the temperature of different electronic components 104 from amongst the plurality of electronic components 104 may vary based upon a number of factors. For example, a particular electronic component 104 may be subjected to an increased load, initialization procedure, varying environmental conditions, etc. that causes the particular electronic component 104 to generate greater heat than other electronic components 104. By way of a particular, nonlimiting example, in which the plurality of electronic components 104 are GPUs, a particular GPU that is located downstream (e.g., closer to the second end 103 than other GPUs) may be relatively warmer due to the relatively warmer air that is circulated across this particular GPU. Said differently, the air that convectively cools the particular GPU is preheated by the heat that is dissipated from upstream GPUs.

In order to selectively dissipate heat from one or more of the plurality of electronic components 104, the apparatus 100 may include an air direction mechanism 118 that directs the air within the housing 102 and/or from particular airflows 106, 110 to defined locations within the housing 102. As shown, the apparatus 100 may include a channel 116 (e.g., pipe, conduit, etc.) through which the secondary airflow 110 may be at least partially directed. In an instance in which, for example, the computing device 200 determines that a particular electronic component 104 requires additional cooling, the air direction mechanism 118 may pivot to direct air in the direction of the particular electronic component 104. Although illustrated in FIG. 4 as a pivoting flapper, the present disclosure contemplates that the air direction mechanism 118 may use any device (e.g., pressurized plenum, actuated baffle, etc.) to selectively direct air within the housing 102.

Example Computing Device

The computing device 200 may include circuitry, networked processors, or the like configured to perform some or all of the apparatus-based (e.g., thermal management-based) processes described herein and may be any suitable controller, network card, graphical processing unit (GPU), microcontroller, computing device, network server, and/or other type of processing device. In this regard, the computing device 200 may be embodied by any of a variety of devices. For example, the computing device 200 may be configured to receive/transmit data and may include any of a variety of fixed terminals, such as a server, microcontroller, desktop, or kiosk, or it may comprise any of a variety of mobile terminals, such as a portable digital assistant (PDA), mobile telephone, smartphone, laptop computer, tablet computer, or in some embodiments, a peripheral device that connects to one or more fixed or mobile terminals. Example embodiments contemplated herein may have various form factors and designs but will nevertheless include at least the components illustrated in FIG. 5 and described in connection therewith. Despite the many arrangements contemplated herein, the computing device 200 is shown and described herein as a single computing device for ease of explanation and to avoid unnecessarily overcomplicating the disclosure.

Figure 5:
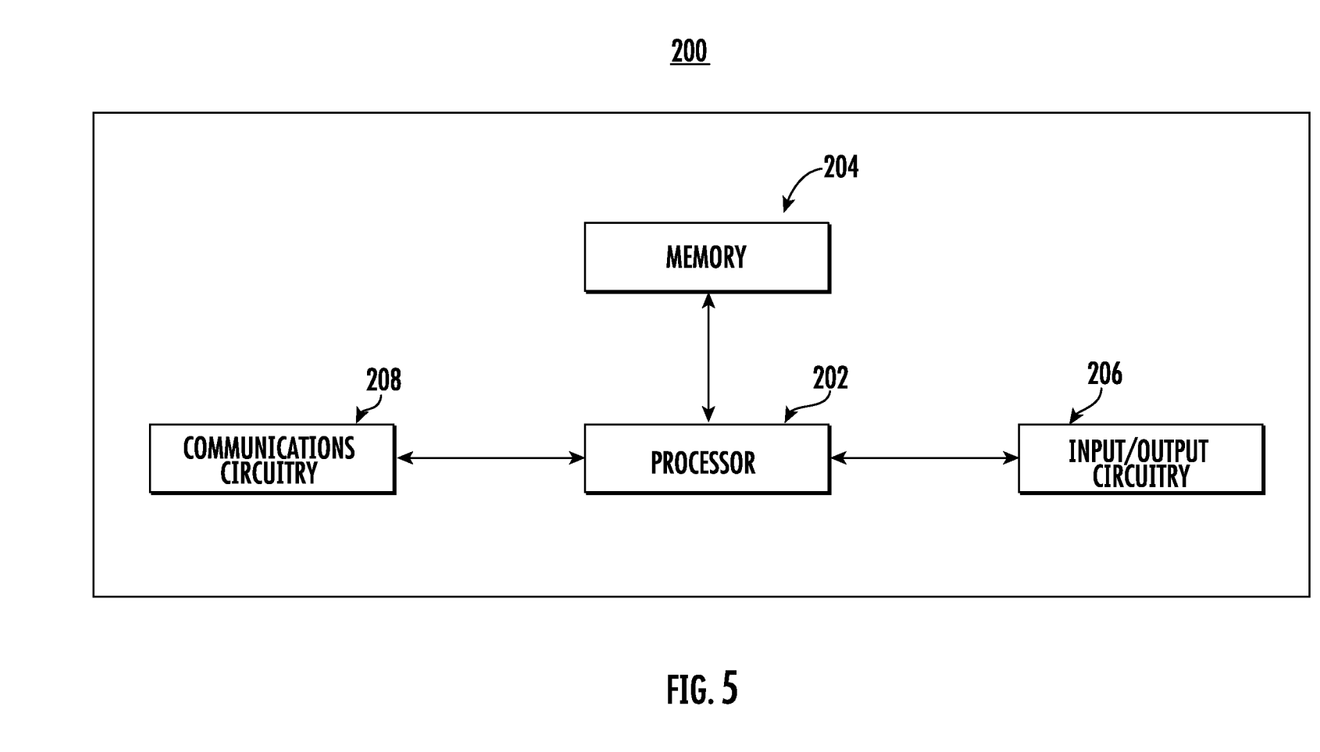
FIG. 5 illustrates a schematic block diagram of an example computing device that may perform various operations, in accordance with some example embodiments described herein.

As illustrated in FIG. 5, the computing device 200 may include a processor 202, a memory 204, communications circuitry 208, and input/output circuitry 206. The computing device 200 may be configured to execute some of the operations described below in connection with FIG. 6. Although components 202-208 are described in some cases using functional language, it should be understood that the particular implementations necessarily include the use of particular hardware. It should also be understood that certain of these components 202-208 may include similar or common hardware. For example, two sets of circuitry may both leverage use of the same processor 202, memory 204, communications circuitry 208, or the like to perform their associated functions, such that duplicate hardware is not required for each set of circuitry. The use of the term "circuitry" as used herein includes particular hardware configured to perform the functions associated with respective circuitry described herein. As described in the example above, in some embodiments, various elements or components of the circuitry of the computing device 200 may be housed within the thermal management apparatus 100. It will be understood in this regard that some of the components described in connection with the computing device 200 may be housed within one of these devices, while other components may be housed within another of these devices, or by yet another device not expressly illustrated in FIGS. 1-4.

Of course, while the term "circuitry" should be understood broadly to include hardware, in some embodiments, the term "circuitry" may also include software for configuring the hardware. For example, although "circuitry" may include processing circuitry, storage media, network interfaces, input/output devices, and the like, other elements of the computing device 200 may provide or supplement the functionality of particular circuitry.

In some embodiments, the processor 202 (and/or coprocessor or any other processing circuitry assisting or otherwise associated with the processor) may be in communication with the memory 204 via a bus for passing information among components of the computing device 200. The memory 204 may be non-transitory and may include, for example, one or more volatile and/or non-volatile memories. For example, the memory may be an electronic storage device (e.g., a non-transitory computer readable storage medium). The memory 204 may be configured to store information, data, content, applications, instructions, or the like, for enabling the computing device 200 to carry out various functions in accordance with example embodiments of the present disclosure.

The processor 202 may be embodied in a number of different ways and may, for example, include one or more processing devices configured to perform independently. Additionally, or alternatively, the processor may include one or more processors configured in tandem via a bus to enable independent execution of instructions, pipelining, and/or multithreading. The use of the term "processing circuitry" may be understood to include a single core processor, a multi-core processor, multiple processors internal to the security circuitry, and/or remote or "cloud" processors.

In an example embodiment, the processor 202 may be configured to execute instructions stored in the memory 204 or otherwise accessible to the processor 202. Alternatively, or additionally, the processor 202 may be configured to execute hard-coded functionality. As such, whether configured by hardware or by a combination of hardware with software, the processor 202 may represent an entity (e.g., physically embodied in circuitry) capable of performing operations according to an embodiment of the present disclosure while configured accordingly. Alternatively, as another example, when the processor 202 is embodied as an executor of software instructions, the instructions may specifically configure the processor 202 to perform the algorithms and/or operations described herein when the instructions are executed.

The computing device 200 may further include input/output circuitry 206 that may, in turn, be in communication with the processor 202 to provide output to a user and to receive input from a user, user device, or another source. In this regard, the input/output circuitry 206 may comprise a display that may be manipulated by an application. In some embodiments, the input/output circuitry 206 may also include additional functionality such as a keyboard, a mouse, a joystick, a touch screen, touch areas, soft keys, a microphone, a speaker, or other input/output mechanisms. The computing device 200 comprising the processor 202 may be configured to control one or more functions of a display through computer program instructions (e.g., software and/or firmware) stored on a memory accessible to the processor (e.g., the memory 204 and/or the like).

The communications circuitry 208 may be any means such as a device or circuitry embodied in either hardware or a combination of hardware and software that is configured to receive and/or transmit data from/to a network and/or any other device, circuitry, or module in communication with the computing device 200. In this regard, the communications circuitry 208 may include, for example, a network interface for enabling communications with a wired or wireless communication network. For example, the communications circuitry 208 may include one or more network interface cards, antennae, buses, switches, routers, modems, and supporting hardware and/or software, or any other device suitable for enabling communications via a network. Additionally, or alternatively, the communication interface may include the circuitry for interacting with the antenna(s) to cause transmission of signals via the antenna(s) or to handle receipt of signals received via the antenna(s). These signals may be transmitted by the computing device 200 using any of a number of wireless personal area network (PAN) technologies, such as Bluetooth® v1.0 through v3.0, Bluetooth Low Energy (BLE), infrared wireless (e.g., IrDA), ultra-wideband (UWB), induction wireless transmission, or the like. In addition, it should be understood that these signals may be transmitted using Wi-Fi, Near Field Communications (NFC), Worldwide Interoperability for Microwave Access (WiMAX) or other proximity-based communications protocols.

As used herein, the term "computer-readable medium" refers to non-transitory storage hardware, non-transitory storage device or non-transitory computer system memory that may be accessed by a controller, a microcontroller, a computational system or a module of a computational system to encode thereon computer-executable instructions or software programs. A non-transitory "computer-readable medium" may be accessed by a computational system or a module of a computational system to retrieve and/or execute the computer-executable instructions or software programs encoded on the medium. Exemplary non-transitory computer-readable media may include, but are not limited to, one or more types of hardware memory, non-transitory tangible media (for example, one or more magnetic storage disks, one or more optical disks, one or more USB flash drives), computer system memory or random-access memory (such as, DRAM, SRAM, EDO RAM), and the like.

Example Methods for Thermal Management

Figure 6:
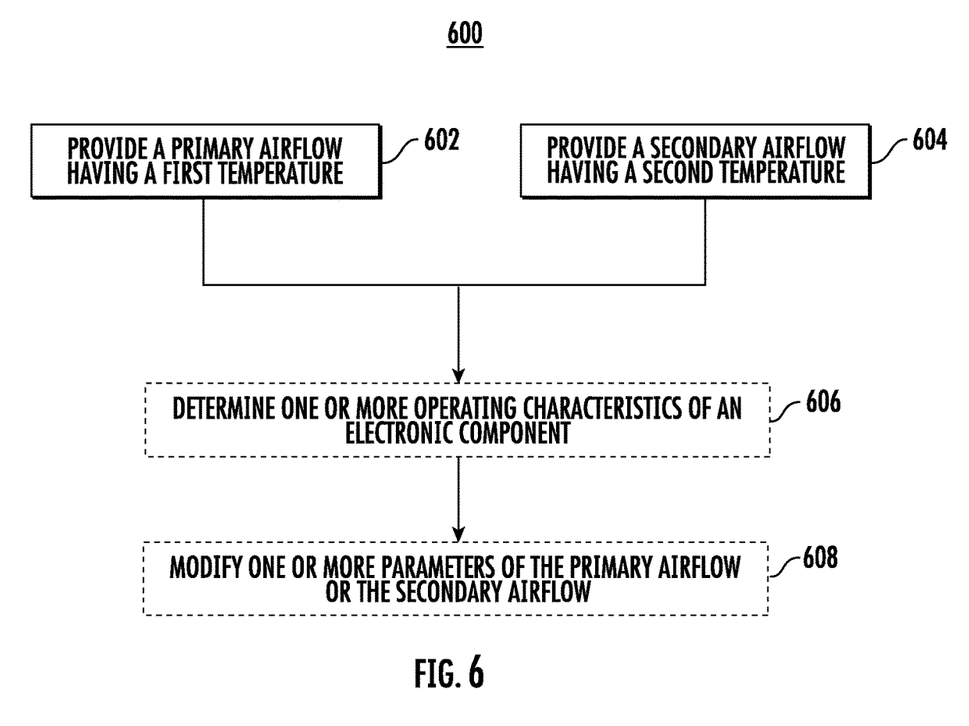
FIG. 6 is a flowchart illustrating a method of thermal management according to an example embodiment.

Turning next to FIG. 6, a flowchart of an example method for thermal management is provided. The operations illustrated in FIG. 6 may, for example, be performed by, with the assistance of, and/or under the control of an apparatus (e.g., computing device 200), as described above. In this regard, performance of the operations may invoke one or more of processor 202, memory 204, and/or input/output circuitry 206, communications circuitry 208.

As shown in operation 602, the method 600 may include providing to a housing a primary airflow having a first temperature. As described above, the housing may have a primary inlet configured to receive a primary airflow that includes at least a first temperature. The primary inlet may define an opening, aperture, channel, etc. in fluid communication with an interior of the housing and the primary airflow. The primary airflow may refer to the airflow that is traditionally supplied to computing devices in order to attempt to dissipate heat from these devices. As such, the primary airflow may be supplied to the housing by one or more conduits, channels, tubes, etc. Furthermore, the primary airflow may be communicably coupled with a fan or similar element configured to drive or otherwise force the primary airflow into the housing and along the airflow direction that travels from a first end to a second end of the housing.

As described above, the primary airflow alone may be insufficient to effectively dissipate heat from the electronic components supported by the housing. Furthermore, due to the potential for condensation to form, the first temperature of the primary airflow may greater than a dew point of an external environment of the housing. Said differently, attempting to lower the first temperature of the primary airflow in order to increase the ability of the primary airflow to dissipate heat may result in lowering the first temperature below the dew point for the particular environmental conditions associated with the housing. As described above, however, the present disclosure contemplates that, in some embodiments, the first temperature of the primary airflow may instead be decreased while the second temperature of the secondary airflow is increased.

As shown in operation 604, the method 600 may include providing a secondary airflow to the housing having a second temperature. The secondary airflow may be supplied in conjunction with the primary airflow described above with reference to operation 602. In some embodiments, however, the secondary airflow may only be supplied in instances in which the primary airflow is incapable of providing sufficient heat dissipation. As described above, the housing may define a secondary inlet configured to receive a secondary airflow having a second temperature that is less than the first temperature. The secondary inlet may also define an opening, aperture, channel, etc. in fluid communication with an interior of the housing and the secondary airflow.

In order to substantially reduce the temperature of the airflow within the housing (e.g., the combined primary airflow and the secondary airflow), the second temperature of the secondary airflow may be substantially lower than the first temperature of the primary airflow. In order to generate the secondary airflow having the second temperature, the secondary airflow may be associated with a Ranque-Hilsch vortex tube or other device or technique for generating sufficiently cold air temperatures. The combination of the primary airflow and the secondary airflow within the interior of the housing may substantially lower the collective temperature of the air within the interior of the housing and, therefore, increase the heat collectively dissipated from the electronic components within the housing. In order to avoid the condensation of moisture that may be suspended in the airflows described herein, the temperature of the combined primary airflow and the secondary airflow may greater than a dew point of an external environment of the housing as described above, and a temperature of the airflow exiting the housing via the second end may be greater than the dew point of the external environment of the housing. The primary airflow and the secondary airflow may further be collectively configured to dissipate heat generated by the electronic component(s) while maintaining an air temperature internal to the housing that is greater than a dew point associated with an interior of the housing.

In some embodiments, the method 600 may include determining one or more operating characteristics of an electronic component within the housing. By way of example, the computing device 200 may be communicably coupled with the electronic components (e.g., GPUs or the like) and receive data indicative of the operating characteristics of these components. The data received by the computing device 200 may be indicative of an increased power consumption, an increased temperature, and/or any other measurable characteristic of the electronic component. By way of a particular example, the data received by the computing device 200 may be indicative of performance of an initialization procedure for the electronic components that results in an increased thermal load for these components (e.g., an increased relative temperature).

Thereafter, in some embodiments, the method 600 may include modifying one or more parameters of the primary airflow or the secondary airflow to address these characteristics of the electronic components. For example, the computing device 200 may be operably coupled with the secondary airflow (e.g., a vortex tube implementation or the like) and cause the secondary airflow to reduce the second temperature of the secondary airflow. Additionally or alternatively, the computing device 200 may be operably coupled with the primary airflow and/or the secondary airflow (e.g., a fan or equivalent device) and modify an air volume (e.g., flow rate) of the primary airflow or the secondary airflow (e.g., increase the cubic feet per minute (CFM)) of either the primary airflow or the secondary airflow to increase the flow rate of the air within the housing to dissipate more heat. By way of an additional example, an increase in data movement associated with one or more of the electronic components (GPUs/CPUs) described herein may result in an increase in power consumption and, therefore, and increase in heat generation. In some instances, the computing device 200 may operate as a job scheduler that may selectively assign tasks to the electronic components. Although described herein with reference to air temperature and speed, the present disclosure contemplates that any parameter of the primary and/or secondary airflow may be modified to address any number of operating characteristics associated with the electronic components.

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of any optical component or optoelectronic element. In addition, the methods described above may include fewer steps in some cases, while in other cases may include additional steps. Modifications to the steps of the method described above, in some cases, may be performed in any order and in any combination.

Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

That which is claimed:

1. A thermal management apparatus comprising:
   a housing defining:
      a first end; and
      a second end opposite the first end;
   an electronic component supported within the housing;
   a primary inlet configured to receive a primary airflow having a first temperature; and
   a secondary inlet configured to receive a secondary airflow having a second temperature, wherein the second temperature is different than the first temperature,
   wherein the primary airflow and the secondary airflow are collectively configured to dissipate heat generated by the electronic component while maintaining an air temperature internal to the housing greater than a dew point associated with an interior of the housing.

2. The thermal management apparatus of claim 1, wherein the primary inlet and the secondary inlet are disposed proximate the first end of the housing.

3. The thermal management apparatus of claim 2, wherein the primary airflow and the secondary airflow collectively define an airflow direction traveling from the first end of the housing to the second end of the housing.

4. The thermal management apparatus of claim 3, wherein the primary airflow and the secondary airflow collectively exit the housing via the second end.

5. The thermal management apparatus of claim 1, wherein the second temperature is less than the first temperature.

6. The thermal management apparatus of claim 1, wherein a temperature of the airflow exiting the housing via the second end is greater than the dew point of the external environment of the housing.

7. The thermal management apparatus of claim 1, further comprising a computing device communicably coupled to the primary airflow and the secondary airflow.

8. The thermal management apparatus of claim 7, wherein the computing device is configured to modify one or more parameters of the primary airflow or the secondary airflow based upon one or more operating characteristics of the electronic component.

9. The thermal management apparatus of claim 8, wherein the computing device is configured to modify the second temperature of the secondary airflow.

10. The thermal management apparatus of claim 8, wherein the computing device is configured to modify a flow rate of the primary airflow or the secondary airflow.

11. The thermal management apparatus of claim 1, further comprising a plurality of electronic components including the electronic component.

12. The thermal management apparatus of claim 11, further comprising an air direction mechanism configured to selectively dissipate heat from one or more of the plurality of electronic components.

13. The thermal management apparatus of claim 1, wherein the electronic component is a graphics processing unit (GPU).

14. A method for thermal management comprising:
providing a primary airflow having a first temperature to a housing; and
providing to the housing a secondary airflow having a second temperature, wherein the second temperature is different than the first temperature,
wherein the primary airflow and the secondary airflow are collectively configured to dissipate heat generated by an electronic component supported within the housing while maintaining an air temperature internal to the housing greater than a dew point associated with an interior of the housing.

15. The method of claim 14, wherein the housing defines a first end and a second end opposite the first end, the primary airflow and the secondary airflow provided to the housing proximate the first end.

16. The method of claim 15, wherein the primary airflow and the secondary airflow collectively define an airflow direction traveling from the first end of the housing to the second end of the housing.

17. The method of claim 15, wherein the primary airflow and the secondary airflow collectively exit the housing via the second end.

18. The method of claim 14, wherein the second temperature is less than the first temperature.

19. The method of claim 14, wherein a temperature of the airflow exiting the housing via the second end is greater than the dew point of the external environment of the housing.

20. The method of claim 14, wherein the electronic component is a graphics processing unit (GPU).

* * * * *